United States Patent
Ishibashi

(10) Patent No.: US 8,669,826 B2
(45) Date of Patent: Mar. 11, 2014

(54) RADIO TRANSMITTER

(75) Inventor: Hiroyuki Ishibashi, Kawasaki (JP)

(73) Assignee: Kabushiki Kaisha Kenwood, Tokyo (JP)

(*) Notice: Subject to any disclaimer, the term of this patent is extended or adjusted under 35 U.S.C. 154(b) by 60 days.

(21) Appl. No.: 13/137,764

(22) Filed: Sep. 12, 2011

(65) Prior Publication Data
US 2012/0069932 A1    Mar. 22, 2012

(30) Foreign Application Priority Data
Sep. 16, 2010    (JP) .................................. 2010-207823

(51) Int. Cl.
*H03C 3/00*    (2006.01)

(52) U.S. Cl.
USPC ........... 332/127; 332/100; 332/123; 332/117; 375/303

(58) Field of Classification Search
USPC .............. 332/100, 117, 127, 123; 331/16, 34; 375/303
See application file for complete search history.

(56) References Cited

U.S. PATENT DOCUMENTS

| 7,522,011 B2* | 4/2009 | Matero et al. ................. 332/128 |
| 7,750,750 B2* | 7/2010 | Plevridis et al. .............. 332/119 |
| 2007/0036238 A1 | 2/2007 | Matero et al. | |

FOREIGN PATENT DOCUMENTS

| JP | 2000-341046 | 12/2000 |
| JP | 2005-072875 | 3/2005 |
| JP | 2005-287010 | 10/2005 |
| JP | 2005-304004 | 10/2005 |

* cited by examiner

*Primary Examiner* — Arnold Kinkead
(74) *Attorney, Agent, or Firm* — Louis Woo

(57) ABSTRACT

A radio transmitter includes a signal processing circuit splitting a basic modulating signal into first and second modulating signals and outputting the first and second modulating signals. A PLL decides a fundamental wave. A VCO forms a portion of the PLL and modulates the fundamental wave decided by the PLL in accordance with a voltage of the first modulating signal outputted from the signal processing circuit. A PLL circuit forms a portion of the PLL and varies a frequency division ratio to modulate the fundamental wave decided by the PLL in accordance with the second modulating signal outputted from the signal processing circuit.

4 Claims, 7 Drawing Sheets

RADIO TRANSMITTER

BACKGROUND OF THE INVENTION

1. Field of the Invention

This invention relates to a radio transmitter including a frequency modulator or an FSK (frequency shift keying) modulator using a PLL (phase-locked loop).

2. Description of the Related Art

Some frequency modulators or FSK (frequency shift keying) modulators include a PLL (phase-locked loop) using a signal generated by a VCXO (voltage controlled crystal oscillator) as a reference-frequency signal. A modulating signal is inputted to a VCO (voltage controlled oscillator) forming a part of the PLL. The VCO serves to modulate a carrier in accordance with the modulating signal to generate a modulation-resultant signal.

In some cases, for implementing modulation in a wide frequency range from the direct current to several kHz, the VCXO is used to modulate the reference-frequency signal in accordance with the modulating signal. In these cases, there are two modulation paths, that is, a VCO-based modulation path and a VCXO-based modulation path.

The VCO-based modulation path and the VCXO-based modulation path have different frequency responses. It is known to compensate for such a frequency-response difference between the two modulation paths. Specifically, Japanese patent application publication number 2000-341046 discloses a frequency modulation (FM) circuit including a VCO-based modulation path and a VCXO-based modulation path in which one of the two modulation paths is designed to adjust the balance in frequency-dependent modulation index between the two modulation paths.

It is desirable that the frequency deviation (shift) caused by the VCXO is sensitive to a control voltage applied thereto for making the modulation by the VCXO proper. Generally, it tends to be difficult to attain conformity with the standards for system frequency variation while considering a change in the frequency of a signal outputted from the VCXO which is caused by a change in the ambient temperature.

SUMMARY OF THE INVENTION

It is an object of this invention to provide a radio transmitter which can meet requirements for smaller frequency variation while maintaining a flat frequency response of modulation.

A first aspect of this invention provides a radio transmitter comprising a signal processing circuit splitting a basic modulating signal into first and second modulating signals and outputting the first and second modulating signals; a PLL deciding a fundamental wave; a VCO forming a portion of the PLL and modulating the fundamental wave decided by the PLL in accordance with a voltage of the first modulating signal outputted from the signal processing circuit; and a PLL circuit forming a portion of the PLL and varying a frequency division ratio to modulate the fundamental wave decided by the PLL in accordance with the second modulating signal outputted from the signal processing circuit.

A second aspect of this invention is based on the first aspect thereof, and provides a radio transmitter further comprising a phase adjustment section adjusting at least one of phases of the first and second modulating signals.

A third aspect of this invention is based on the first aspect thereof, and provides a radio transmitter further comprising a frequency-response adjustment section adjusting at least one of frequency profiles of the first and second modulating signals.

A fourth aspect of this invention provides a radio transmitter comprising a PLL providing a carrier; a VCO in the PLL; a frequency divider in the PLL and having a variable frequency division ratio; a first path transferring a modulating signal and applying the transferred modulating signal to the VCO as a control voltage for the VCO to modulate the carrier in accordance with the modulating signal applied to the VCO; and a second path transferring the modulating signal and applying the transferred modulating signal to the frequency divider to vary the frequency division ratio of the frequency divider and thereby modulate the carrier in accordance with the modulating signal applied to the frequency divider; wherein the modulation of the carrier in accordance with the modulating signal applied to the VCO and the modulation of the carrier in accordance with the modulating signal applied to the frequency divider are simultaneously active.

A fifth aspect of this invention is based on the fourth aspect thereof, and provides a radio transmitter further comprising a phase adjuster adjusting at least one of phases of the modulating signal applied to the VCO and the modulating signal applied to the frequency divider.

A sixth aspect of this invention is based on the fourth aspect thereof, and provides a radio transmitter further comprising a frequency-response adjuster adjusting at least one of frequency profiles of the modulating signal applied to the VCO and the modulating signal applied to the frequency divider.

The radio transmitters of this invention are advantageous in that they can meet requirements for smaller frequency variation while maintaining a flat frequency response of modulation.

BRIEF DESCRIPTION OF THE DRAWINGS

FIG. 3(*b*) is a diagram of the relation of the noise level in a modulation structure with frequency.

FIG. 4(*b*) is a diagram of a second example of the details of the switch in FIG. 1.

FIG. 5(*b*) is a time-domain diagram of the waveform of a modulating signal in the VCO-based modulation path, the waveform of a modulating signal in the PLL-based modulation path, and a modulation-index variation of a modulation-resultant signal which occur in the absence of a phase difference between the modulating signals in the two modulation paths.

FIG. 6(*b*) is a diagram of the frequency responses of the composite modulation circuit and a filter implemented by a frequency-response adjustment section in FIG. 1.

FIG. 6(*c*) is a diagram of the frequency responses of the composite modulation circuit and the filter implemented by the frequency-response adjustment section in FIG. 1, and a substantially-flat composite frequency response resulting from combining the two former frequency responses.

DETAILED DESCRIPTION OF THE INVENTION

Figure 1:
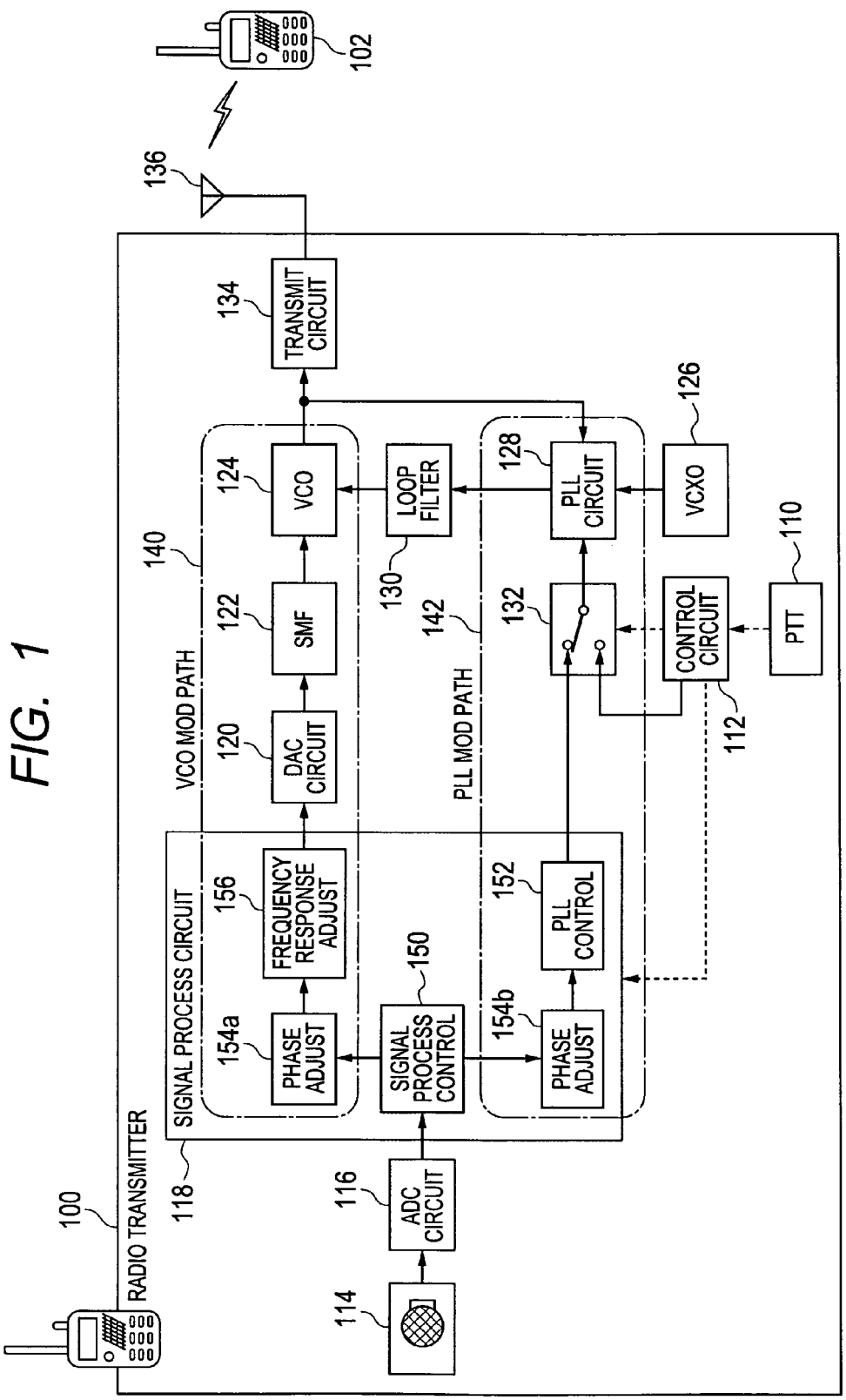
FIG. 1 is a block diagram of a radio transmitter according to a first embodiment of this invention.

Preferred embodiments of this invention will be described hereafter with reference to accompanying drawings. Dimensions, materials, and specific numerical values indicated in the description of the preferred embodiments of this invention are mere examples for an easier understanding of this invention, and do not limit the scope of this invention unless otherwise especially stated. In the present specification and drawings, elements having substantially the same functions and structures are denoted by the same reference characters and duplicate explanations thereof are avoided, and elements having no direct relation with this invention are omitted from the drawings.

In a radio transmitter according to each of the preferred embodiments of this invention, a frequency modulation (FM) circuit or an FSK (frequency shift keying) modulation circuit includes a phase-locked loop (PLL) using an output signal of a VCXO (voltage controlled crystal oscillator) as a reference-frequency signal. The PLL provides a fundamental wave, that is, a carrier. A VCO (voltage controlled oscillator) forming a portion of the PLL modulates the fundamental wave in accordance with a modulating signal including an audio signal. This modulation is FM or FSK (frequency shift keying) modulation.

The radio transmitter according to each of the preferred embodiments of this invention is provided with two modulation paths, that is, a VCO-based modulation path and a PLL-based modulation path. The VCO-based modulation path includes the VCO as a main element. The PLL-based modulation path serves to modulate the fundamental wave by changing a frequency division ratio in a frequency divider within the PLL. The VCO-based modulation path and the PLL-based modulation path cooperate to implement modulation in a wide frequency range from the direct current to several kHz. The radio transmitter is designed to prevent a time-direction signal distortion from being caused by adopting the PLL-based modulation path. The VCO-based modulation path and the PLL-based modulation path have different frequency responses respectively. The radio transmitter is designed to prevent this frequency-response difference from causing a problem in the balance in frequency-dependent modulation index between the VCO-based modulation path and the PLL-based modulation path.

FIG. 1 shows a radio transmitter 100 according to a first embodiment of this invention. In FIG. 1, the solid-line arrows denote the flows of signals to be transmitted such as an audio signal, and the broken-line arrows denote the flows of control signals or commands.

As shown in FIG. 1, the radio transmitter 100 includes a PTT (push to talk) switch 110, a control circuit 112, a sound collector 114, an ADC (analog-to-digital converter) circuit 116, a signal processing circuit 118, a DAC (digital-to-analog converter) circuit 120, an SMF (a smoothing filter) 122, a VCO 124, a VCXO 126, a PLL circuit 128, a loop filter 130, a switch 132, a transmission circuit 134, and an antenna 136. The radio transmitter 100 sends a modulation-resultant signal to, for example, a radio receiver 102.

The signal processing circuit 118, the DAC circuit 120, the SMF 122, the VCO 124, the VCXO 126, the PLL circuit 128, and the loop filter 130 are connected to form an FM circuit, an FSK modulation circuit, or another modulation circuit similar in principle to the FM circuit or the FSK modulation circuit.

The PTT switch 110 includes an operation switch of the push type which can be actuated by a user to accept user's instruction or request. When the user pushes the PTT switch 110, operation of the radio transmitter 100 changes from a stand-by mode to a transmission mode. When the user releases the PTT switch 110, operation of the radio transmitter 100 returns from the transmission mode to the stand-by mode. In the case where the user speaks into the sound collector 114 while continuing to push the PTT switch 110, the sound collector 114 changes the user's speech into a corresponding audio signal and the radio transmitter 100 sends the audio signal.

The control circuit 112 includes a semiconductor integrated circuit having a combination of a CPU (central processing unit), a ROM (read only memory), a RAM (random access memory), and an input/output port. The semiconductor integrated circuit forms a computer. The ROM stores a computer program and reference signals or data including, for example, frequency data. The RAM is used as a work area. The control circuit 112 manages and controls the whole of the radio transmitter 100 according to the computer program in the ROM. The computer program is designed to enable the control circuit 112 to implement operation steps mentioned hereafter.

When the user actuates the PTT switch 110, the corresponding user's instruction is inputted to the control circuit 112 via the PTT switch 110. The control circuit 112 issues control commands to the signal processing circuit 118 and the switch 132 in response to the user's instruction, and thereby controls the signal processing circuit 118 and the switch 132.

Specifically, upon the reception of the user's instruction, the control circuit 112 controls the switch 132 to connect the PLL circuit 128 to the control circuit 112 and disconnect the PLL circuit 128 from the signal processing circuit 118. Then, the control circuit 112 sets frequency data for a fundamental wave (carrier) in the PLL circuit 128. The frequency of the carrier is equalized to the central frequency of one selected from transmission channels in accordance with the frequency data. Thereafter, the control circuit 112 controls the switch 132 to disconnect the PLL circuit 128 from the control circuit 112 and connect the PLL circuit 128 to the signal processing circuit 118. In this case, audio data is transferred from the signal processing circuit 118 to the PLL circuit 128, and the frequency of the carrier is shifted within the selected transmission channel in response to the audio data so that the carrier is modulated in accordance with the audio data.

The sound collector 114 includes a microphone, an input amplifier, and an LPF (a low pass filter). The microphone changes received sounds into a corresponding electric analog audio signal. The input amplifier enlarges the audio signal. The LPF removes high-frequency components from the enlarged audio signal to generate a filtered analog audio signal. The LPF feeds the filtered analog audio signal to the ADC circuit 116.

The ADC circuit 116 periodically samples the filtered analog audio signal at a frequency of, for example, 96 kHz, and converts every resultant analog sample into a corresponding digital sample. Thus, the ADC circuit 116 generates a sequence of digital samples called digital audio data. The ADC circuit 116 feeds the digital audio data to the signal processing circuit 118. The analog audio signals and the digital audio data are substantially equal in contents information. The analog audio signals and the digital audio data are synonymous with modulating signals.

The signal processing circuit 118 includes a DSP (digital signal processor) or an FPGA (a field-programmable gate array). The signal processing circuit 118 operates according to a computer program stored in the DSP or the FPGA. The computer program is designed to enable the signal processing circuit 118 to implement operation steps mentioned hereafter. Alternatively, the signal processing circuit 118 may include an ASIC (application specific integrated circuit).

The signal processing circuit 118 receives the audio data from the ADC circuit 116, and processes the received audio data into first and second processed audio data. The signal processing circuit 118 feeds the first processed audio data to a VCO-based modulation path 140 and feeds the second processed audio data to a PLL-based modulation path 142 independently. The first and second processed audio data are used as modulating signals applied to the VCO-based modulation path 140 and the PLL-based modulation path 142 respectively.

The digital audio data outputted from the ADC circuit 116 is referred to as a basic modulating signal also. The signal processing circuit 118 processes and splits the basic modulating signal into first and second modulating signals directed to the VCO-based modulation path 140 and the PLL-based modulation path 142 respectively.

The computer program in the signal processing circuit 118 enables the signal processing circuit 118 to function as a signal processing control section 150, a PLL control section 152, phase adjustment sections 154a and 154b, and a frequency-response adjustment section 156. The phase adjustment section 154a and the frequency-response adjustment section 156 form portions of the VCO-based modulation path 140. The phase adjustment section 154b and the PLL control section 152 form portions of the PLL-based modulation path 142.

The signal processing control section 150 receives the digital audio data from the ADC circuit 116. The signal processing control section 150 superimposes a signal representative of a subtone on the received digital audio data to generate subtone-added digital audio data. The subtone signal continues to be sent together with the audio contents of the digital audio data while the PTT switch 110 remains pushed. The radio receiver 102 has a squelch circuit and a tone squelch function. While the radio receiver 102 continues to receive the subtone signal, the tone squelch function continuously opens the squelch circuit in response to the received subtone signal and an analog audio signal recovered from the received digital audio data continues to be fed to, for example, a loudspeaker. Preferably, the subtone signal is a tone signal of a prescribed frequency equal to or lower than 300 Hz which conforms to the CTCSS (continuous tone coded squelch system). The subtone signal may be an extended tone signal conforming to the DCS (digital code squelch) system. The subtone signal may be of an NRZ (non return to zero) code.

The signal processing circuit 150 feeds the subtone-added digital audio data to both the phase adjustment sections 154a and 154b. Thus, the signal processing control section 150 feeds the subtone-added digital audio data to both the VCO-based modulation path 140 and the PLL-based modulation path 142. The subtone-added digital audio data fed to the phase adjustment section 154a (the first modulating signal) and the subtone-added digital audio signal fed to the phase adjustment section 154b (the second modulating signal) are equal in phase and amplitude. The phase adjustment section 154a is followed by the frequency-response adjustment section 156. The phase adjustment sections 154a and 154b and the frequency-response adjustment section 156 adjust the phase and amplitude of the subtone-added digital audio data so as to prevent a modulation-resultant signal caused by both modulation via the VCO-based modulation path 140 and modulation via the PLL-based modulation path 142 from being distorted in modulating components. As a result of the phase and amplitude adjustments, the signal processing circuit 118 generates adjusted digital audio data for the VCO-based modulation path 140 and adjusted digital audio data for the PLL-based modulation path 142 which can be different in phase and amplitude.

The PLL control section 152 receives, from the phase adjustment section 154b, the adjusted digital audio data for the PLL-based modulation path 142. Provided that the switch 132 connects the PLL control section 152 and the PLL circuit 128, the PLL control section 152 serially transfers the received digital audio data to the PLL circuit 128 in accordance with a control format used by the PLL circuit 128.

The DAC circuit 120 forms a portion of the VCO-based modulation path 140. The DAC circuit 120 receives, from the frequency-response adjustment section 156, the adjusted digital audio data for the VCO-based modulation path 140. The DAC circuit 120 converts the received digital audio data into an analog audio signal at an update rate of, for example, 96 kHz. The DAC circuit 120 applies the analog audio signal to the SMF 122. The SMF 122 forms a portion of the VCO-based modulation path 140. The SMF 122 includes, for example, an LPF (a low pass filter) having a cutoff frequency of 10 kHz. The SMF 122 removes aliasing components caused by the DAC circuit 120 from the applied analog audio signal, and thereby shapes the waveform of the applied analog audio signal to generate a waveform-shaped analog audio signal. The SMF 122 outputs the waveform-shaped analog audio signal to the VCO 124.

The VCO 124, in conjunction with the PLL circuit 128 and the loop filter 130, forms a PLL which decides the frequency of a fundamental wave (carrier). The VCO 124 generates a modulation-resultant signal based on the fundamental wave. The VCO 124 outputs a modulation-resultant signal to the transmission circuit 134. The VCO 124 forms a portion of the VCO-based modulation path 140. Regarding a relatively higher part of the wide frequency range from the direct current to several kHz, the VCO 124 modulates the fundamental wave in accordance with the voltage of the analog audio signal outputted from the SMF 122.

The VCXO 126 includes a crystal oscillator. The VCXO 126 outputs a signal having a frequency proportional to an input voltage. Since the input voltage is fixed or absent, the frequency of the output signal from the VCXO 126 is fixed. Accordingly, it is possible to reduce the modulation sensitivity. Thus, the VCXO 126 can be stably operated. The VCXO 126 may use a temperature-compensated VCXO or a TCXO (temperature-compensated crystal oscillator). The output signal from the VCXO 126 is used as a reference-frequency signal.

The PLL circuit 128 receives the reference-frequency signal from the VCXO 126. The PLL circuit 128 receives the modulation-resultant signal from the VCO 124. The PLL circuit 128 includes a phase comparator provided with a charge pump circuit. The phase comparator implements phase comparison between the reference-frequency signal and the modulation-resultant signal. The charge pump circuit outputs a phase-comparison-resultant signal to the loop filter 130.

The PLL circuit 128 includes a frequency divider having a frequency division ratio which depends on the frequency data from the control circuit 112 or the audio data from the PLL control section 152. Specifically, the PLL circuit 128 includes a fractional-N PLL which repetitively changes a frequency division ratio N (a frequency resolution of, for example, $2^{18}$) in response to the frequency data from the control circuit 112 or the audio data from the PLL control section 152 at an update rate of, for example, 96 kHz, and thereby shifts the frequency of the fundamental wave (carrier) on a stepwise basis in accordance with the frequency data or the audio data.

The frequency shift of the fundamental wave is used for changing the carrier frequency among the central frequencies of different transmission channels in response to the frequency data. Furthermore, regarding a relatively lower part of the wide frequency range from the direct current to several kHz, the frequency shift of the fundamental wave is used for modulating the fundamental wave in accordance with the audio data. Thus, the PLL circuit 128 sets the fundamental wave to a frequency of, for example, several hundreds of MHz in response to the frequency data, and modulates the fundamental wave in accordance with the audio data within a frequency range of several hundreds of Hz.

The loop filter 130 smoothes the output signal (phase-comparison-resultant signal) from the PLL circuit 128 to generate a smoothed signal. The loop filter 130 applies the smoothed signal to the VCO 124 as a control voltage therefor. The PLL has a cutoff frequency decided by the frequency response of the loop filter 130. Therefore, the PLL responds to and follows a variation in the audio data from the PLL control section 152 which is in a frequency range lower than the cutoff frequency. The PLL-based modulation path 142 is advantageous over a VCXO-based modulation path as will be explained below.

Figure 2:
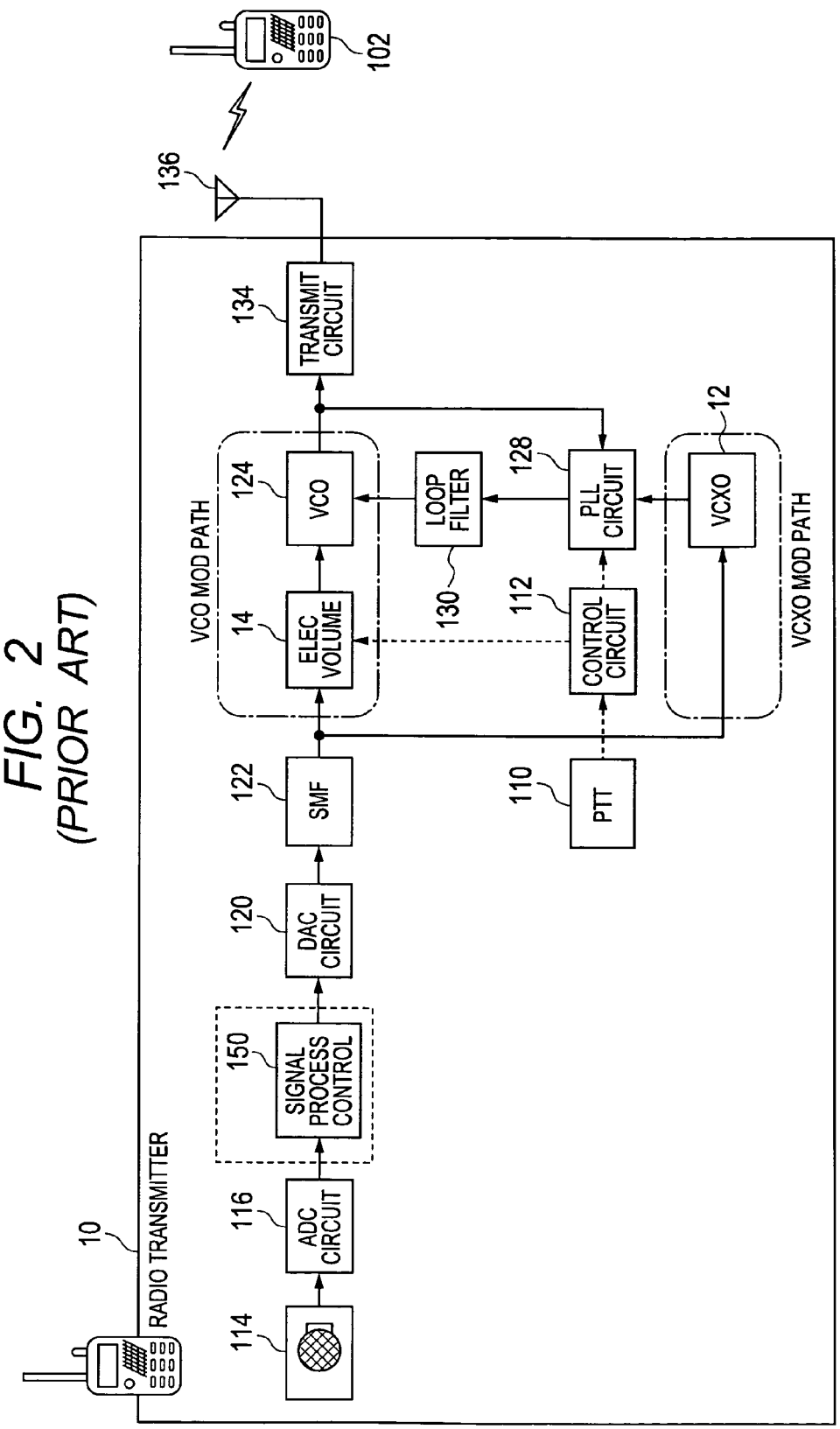
FIG. 2 is a block diagram of a prior-art radio transmitter.

FIG. 2 shows a prior-art radio transmitter 10. The radio transmitter 10 has a VCO-based modulation path and a VCXO-based modulation path which modulate a carrier in accordance with a waveform-shaped analog audio signal outputted from an SMF 122. In the radio transmitter 10, a VCO 124 is a main element of the VCO-based modulation path while a VCXO 12 is a main element of the VCXO-based modulation path.

In the case where the VCXO 12 is a main modulating element, it is desirable to set relatively high the sensitivity of a frequency shift quantity responsive to a control voltage for the VCXO 12. Such a high sensitivity tends to cause operation of the VCXO 12 to be unstable. Thus, it is difficult for the radio transmitter 10 to conform to the standards for system frequency variation while considering an ambient-temperature change.

On the other hand, the radio transmitter 100 of FIG. 1 avoids direction modulation by the VCXO 126. The reference frequency decided by the VCXO 126 is fixed. Instead, modulation is performed through the use of a frequency shift caused by the PLL circuit 128. Frequency modulation and FSK modulation are implemented by the two systems, that is, the VCO-based modulation path 140 and the PLL-based modulation path 142.

The relation between the cutoff frequency fc of the PLL and an arbitrary frequency decides which of the VCO-based modulation path 140 and the PLL-based modulation path 142 is dominant in modulation index at the arbitrary frequency.

Figure 3A:
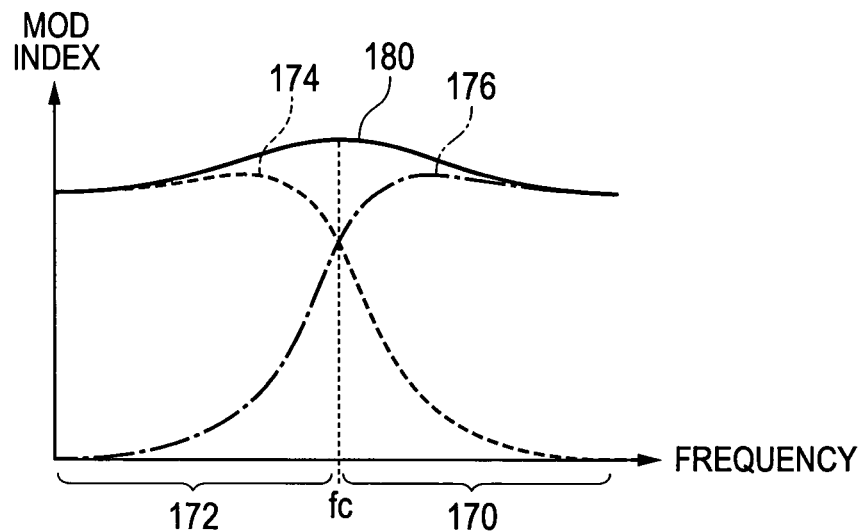
FIG. 3(*a*) is a diagram of the frequency responses of a VCO-based modulation path, a PLL-based modulation path, and a composite modulation circuit in FIG. 1.
Figure 3B:
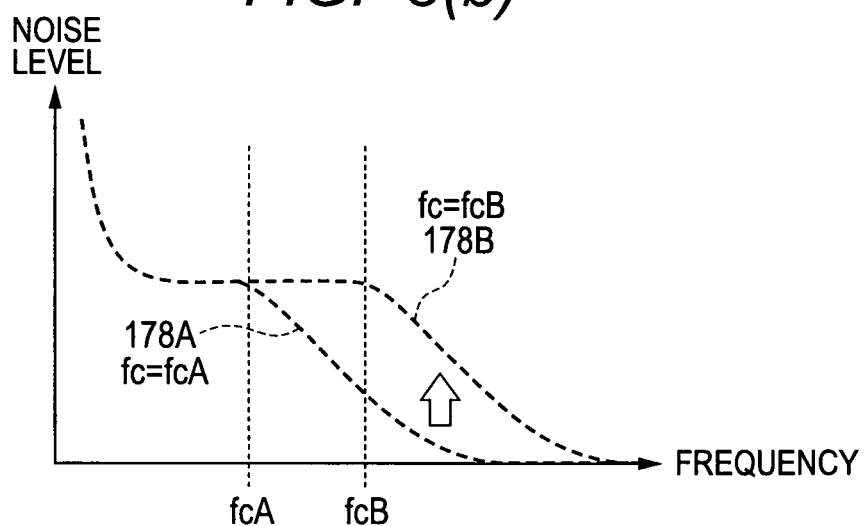

With reference to FIG. 3(*a*), the PLL can hardly respond to a variation in the audio data which is in a frequency range 170 higher than the cutoff frequency fc. The frequency response 174 of the PLL-based modulation path 142 shows that the PLL-based modulation path 142 can hardly contribute to the modulation in the high frequency range 170.

While the PLL does not respond to a variation in the audio data, the output voltage from the loop filter 130 remains constant so that the frequency of the fundamental wave (carrier) with respect to the VCO 124 continues to be fixed.

In FIG. 3(*a*), the frequency response 176 of the VCO-based modulation path 140 shows that the VCO 124 implements effective modulation without being affected by the frequency response of the PLL in the high frequency range 170.

On the other hand, the PLL sufficiently responds to a variation in the audio data which is in a frequency range 172 lower than the cutoff frequency fc. In FIG. 3(*a*), the frequency response 174 of the PLL-based modulation path 142 shows that the PLL-based modulation path 142 effectively contributes to the modulation in the low frequency range 172. Accordingly, the PLL circuit 128 implements effective modulation in the low frequency range 172.

The VCO 124 functions as a portion of the PLL and the modulation by the VCO 124 is significantly affected by the low pass filtering effect of the loop filter 130 in the low frequency range 172. In FIG. 3(*a*), the frequency response 176 of the VCO-based modulation path 140 shows that the VCO 124 can hardly contribute to the modulation in the low frequency range 172.

A consideration is made as to an assumed modulation structure designed so that target modulation is implemented by the PLL-based modulation path 142 only. In the assumed modulation structure, for operation in a wide frequency range, it is necessary to increase the cutoff frequency fc of the PLL.

With reference to FIG. 3(*b*), as the cutoff frequency fc is increased from a value fcA to a value fcB in the assumed modulation structure, the relation of the noise level in the assumed modulation structure with frequency changes from that denoted by the curve 178A to that denoted by the curve 178B. As shown by the curves 178A and 178B, in a high frequency range, the increase in the cutoff frequency fc raises the noise level and decreases the C/N ratio (carrier to noise radio) in the VCO 124. The decrease in the C/N ratio may makes it difficult to meet the system requirements concerning limitations on unwanted powers leaking from the selected transmission channel to the neighboring transmission channels.

In the radio transmitter 100 of FIG. 1, the VCO-based modulation path 140 and the PLL-based modulation path 142 complement each other and provide a resultant or composite modulation circuit having a frequency response 180 (see FIG. 3(*a*)) only slightly different from exactly flat one. The radio transmitter 10 of FIG. 2 has the VCO-based modulation path and the VCXO-based modulation path which uses direct modulation by the VCXO 12. On the other hand, the radio transmitter 100 of FIG. 1 dispenses with direction modulation by the VCXO 126 and can suppress a frequency change in the VCXO 126 which is caused by an ambient-temperature change. Thus, the radio transmitter 100 of FIG. 1 is better in frequency stability than the radio transmitter 10 of FIG. 2.

In the radio transmitter 10 of FIG. 2, the VCXO-based modulation path implements modulation in accordance with the analog audio signal. On the other hand, in the radio transmitter 100 of FIG. 1, the PLL-based modulation path 142 implements modulation in accordance with the digital data. The modulation with the digital data is better than the modulation with the analog signal in accuracy, resolution, and stability.

With reference back to FIG. 1, the switch 132 receives the frequency data from the control circuit 112, and receives the audio data from the PLL control section 152. The switch 132 selectively connects the PLL circuit 128 to either the control circuit 112 or the PLL control section 152 in response to the control command from the control circuit 112. Thus, the switch 132 selectively transfers the frequency data or the audio data to the PLL circuit 128 in response to the control command. The switch 132 includes, for example, a mechanical relay or an analog switch. Alternatively, the switch 132 may include a logic circuit for selecting either the frequency data from the control circuit 112 or the audio data from the PLL control section 152.

Figure 4A:
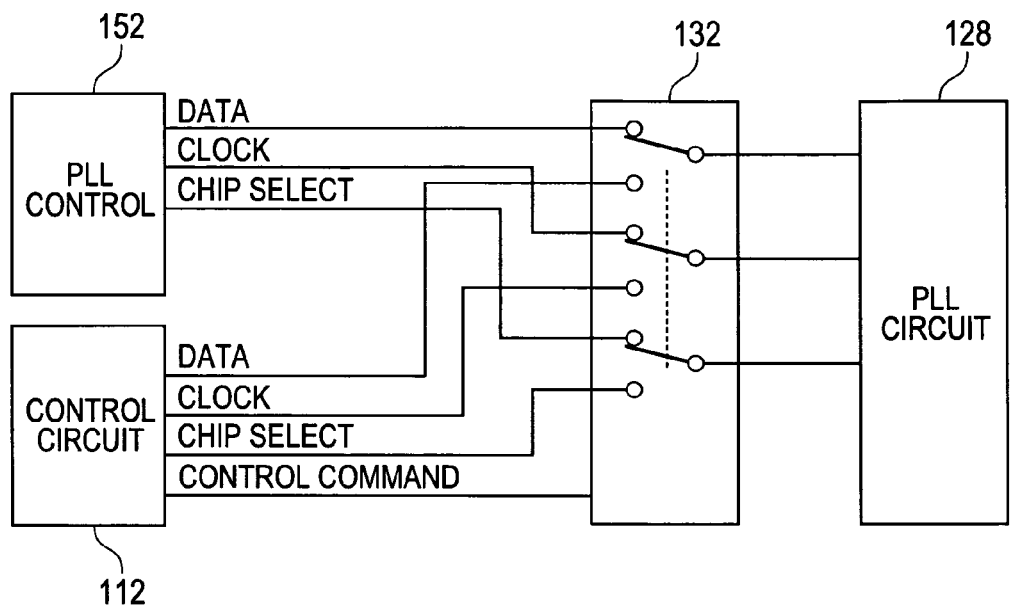
FIG. 4(*a*) is a diagram of a first example of the details of a switch in FIG. 1.

FIG. 4(a) shows a first example of the switch 132. Lines to be controlled by the switch 132 are a line for transferring data (the frequency data or the audio data), a line for transferring a clock signal, and a line for transferring a chip select signal. The switch 132 has mechanical relays, the number of which is equal to that of the lines to be controlled. A data line, a clock-signal line, and a chip-select-signal line extend from the control circuit 112 to the switch 132. Similarly, a data line, a clock-signal line, and a chip-select-signal line extend from the PLL control section 152 to the switch 132. A first mechanical relay in the switch 132 selectively connects the PLL circuit 128 to either the data line from the control circuit 112 or the data line from the PLL control section 152. A second mechanical relay in the switch 132 selectively connects the PLL circuit 128 to either the clock-signal line from the control circuit 112 or the clock-signal line from the PLL control section 152. A third mechanical relay in the switch 132 selectively connects the PLL circuit 128 to either the chip-select-signal line from the control circuit 112 or the chip-select-signal line from the PLL control section 152. The first, second, and third mechanical relays respond to the control command from the control circuit 112. The switch 132 selectively selects either a set of frequency data, a clock signal, and a chip select signal from the control circuit 112 or a set of audio data, a clock signal, and a chip select signal from the PLL control section 152 in response to the control command, and passes the selected set to the PLL circuit 128.

Figure 4B:
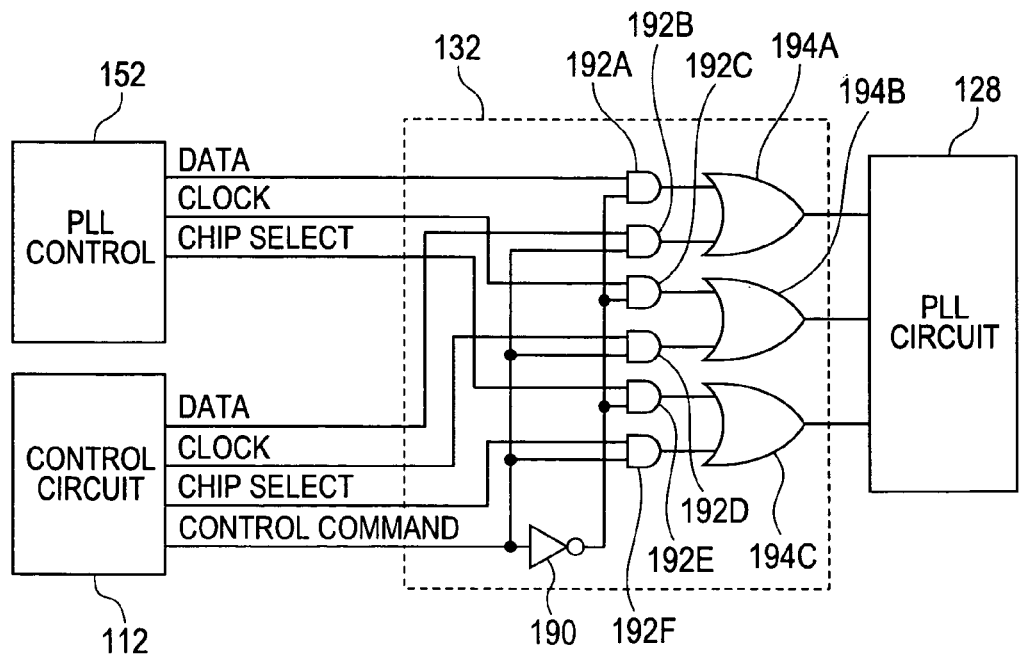

FIG. 4(b) shows a second example of the switch 132. In FIG. 4(b), the switch 132 has a NOT circuit 190, AND circuits 192A-192F, and OR circuits 194A-194C. The data line from the PLL control section 152 extends to a first input terminal of the AND circuit 192A. A second input terminal of the AND circuit 192A is connected to the output terminal of the NOT circuit 190. The data line from the control circuit 112 extends to a first input terminal of the AND circuit 192B. A second input terminal of the AND circuit 192B receives the control command from the control circuit 112. The clock-signal line from the PLL control section 152 extends to a first input terminal of the AND circuit 192C. A second input terminal of the AND circuit 192C is connected to the output terminal of the NOT circuit 190. The clock-signal line from the control circuit 112 extends to a first input terminal of the AND circuit 192D. A second input terminal of the AND circuit 192D receives the control command from the control circuit 112. The chip-select-signal line from the PLL control section 152 extends to a first input terminal of the AND circuit 192E. A second input terminal of the AND circuit 192E is connected to the output terminal of the NOT circuit 190. The chip-select-signal line from the control circuit 112 extends to a first input terminal of the AND circuit 192F. A second input terminal of the AND circuit 192F receives the control command from the control circuit 112. A first input terminal of the OR circuit 194A is connected to the output terminal of the AND circuit 192A. A second input terminal of the OR circuit 194A is connected to the output terminal of the AND circuit 192B. A first input terminal of the OR circuit 194B is connected to the output terminal of the AND circuit 192C. A second input terminal of the OR circuit 194B is connected to the output terminal of the AND circuit 192D. A first input terminal of the OR circuit 194C is connected to the output terminal of the AND circuit 192E. A second input terminal of the OR circuit 194C is connected to the output terminal of the AND circuit 192F. The output terminals of the respective OR circuits 194A-194C are connected to the PLL circuit 128.

When the control command from the control circuit 112 assumes a high-level state, the AND circuits 192B, 192D, and 192F are opened and the AND circuits 192A, 192C, and 192E are closed so that the frequency data, the clock signal, and the chip select signal from the control circuit 112 are transferred to the PLL circuit 128 through the AND circuits 192B, 192D, and 192F and the OR circuits 194A-194C. When the control command from the control circuit 112 assumes a low-level state, the AND circuits 192A, 192C, and 192E are opened and the AND circuits 192B, 192D, and 192F are closed so that the audio data, the clock signal, and the chip select signal from the PLL control section 152 are transferred to the PLL circuit 128 through the AND circuits 192A, 192C, and 192E and the OR circuits 194A-194C.

The switch 132 of FIG. 4(b) is free from chattering. The switch 132 of FIG. 4(b) can stably implement switching between the data and signals from the control circuit 112 and those from the PLL control section 152. Furthermore, the switch 132 of FIG. 4(b) occupies an area narrower than that occupied by the switch 132 of FIG. 4(a).

With reference back to FIG. 1, each of the phase adjustment sections 154a and 154b has the function of delaying the subtone-added digital audio data. The phase adjustment section 154a delays the subtone-added digital audio data by a predetermined time to adjust the phase of the subtone-added digital audio data in the VCO-based modulation path 140. The phase adjustment section 154b delays the subtone-added digital audio data by a predetermined time to adjust the phase of the subtone-added digital audio data in the PLL-based modulation path 142. The delay times concerning the phase adjustment sections 154a and 154b, that is, the quantities of adjustment of the phase of the subtone-added digital audio data, are decided during the manufacture of the radio transmitter 100. The delay times may be changed thereafter. One of the phase adjustment sections 154a and 154b may be omitted.

The frequency shifting signal inputted to the VCO 124 is the analog signal from the SMF 122 while that inputted to the PLL circuit 128 is normally the digital audio data from the PLL control section 152. Thus, the signal processing causing the frequency shifting signal for the VCO 124 significantly differs from that causing the frequency shifting signal for the PLL circuit 128. Accordingly, there may be a phase difference (a phase error) between the frequency shifting signal for the VCO 124 and that for the PLL circuit 128. The phase adjustment sections 154a and 154b are designed to compensate for the above phase difference.

Figure 5A:
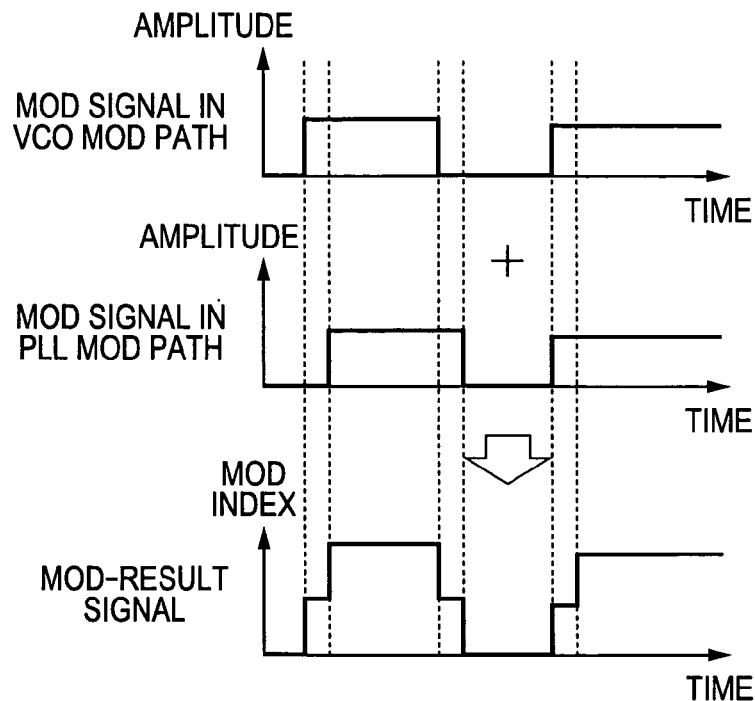
FIG. 5(*a*) is a time-domain diagram showing the waveform of a modulating signal in the VCO-based modulation path, the waveform of a modulating signal in the PLL-based modulation path, and a modulation-index variation of a modulation-resultant signal which occur in the presence of a phase difference between the modulating signals in the two modulation paths.

As shown in FIG. 5(a), when the modulating signal inputted to the PLL circuit 128 in the PLL-based modulation path 142 delays from that inputted to the VCO 124 in the VCO-based modulation path 140, a modulation-resultant signal caused by both the modulation via the PLL circuit 128 and the modulation via the VCO 124 is equivalent to that resulting from modulation of the carrier in accordance with a distorted modulating signal. There is a chance that the radio receiver 102 can not correctly recover original information represented by a distorted modulating signal in a received modulation-resultant signal. As shown in FIG. 5(a), the phase difference between the modulating signals in the two modulation paths 140 and 142 causes distorted waveform edges in modulating components of the modulation-resultant signal. FSK modulation is more adversely affected by the distorted waveform edges than frequency modulation is. Accordingly, it is desirable to prevent such a phase difference from occurring.

Figure 5B:
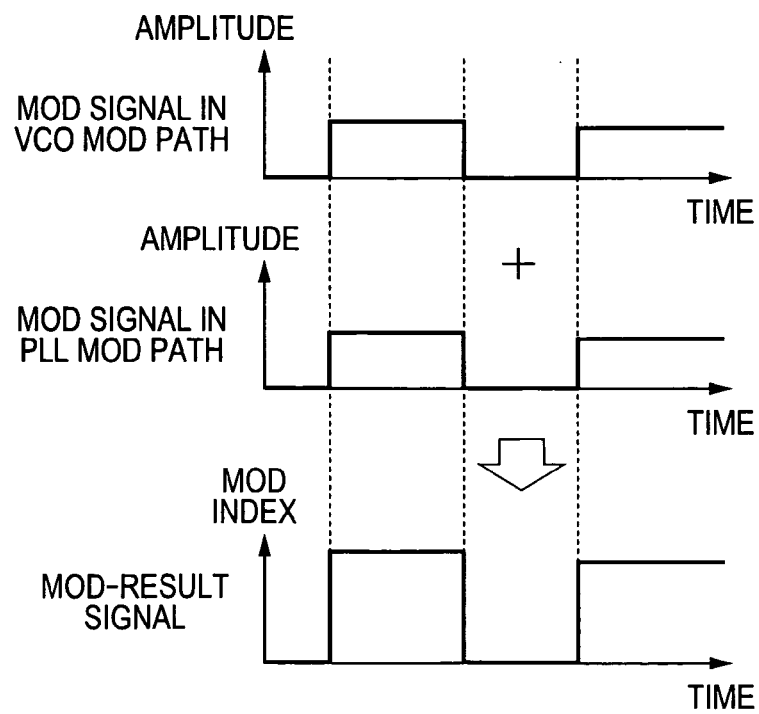

With reference to FIG. 5(b), the phase adjustment sections 154a and 154b are designed to equalize the phases of the modulating signals in the two modulation paths 140 and 142 with respect to the modulation-resultant signal (or the carrier).

The phase adjustment section 154a delays the subtone-added digital audio data by a predetermined time to equalize the phase of the modulating signal inputted to the VCO 124 to the phase of the modulating signal inputted to the PLL circuit 128 with respect to the carrier. Similarly, the phase adjustment section 154b delays the subtone-added digital audio data by a predetermined time to equalize the modulating signal inputted to the PLL circuit 128 to the phase of the modulating signal inputted to the VCO 124 with respect to the carrier. For example, in the case where the DAC circuit 120 in the VCO-based modulation path 140 causes a signal delay, the phase adjustment section 154b in the PLL-based modulation path 142 is designed to provide a signal delay canceling that caused by the DAC circuit 120 to equalize the phases of the modulating signals inputted to the VCO 124 and the PLL circuit 128 with respect to the carrier.

In one of the two modulation paths 140 and 142, the subtone-added digital audio data is delayed by the phase adjustment section 154a or 154b to absorb a phase difference between the modulating signal for the VCO 124 and that for the PLL circuit 128 and thereby reduce a time-direction distortion of modulating components of the modulation-resultant signal. In both the two modulation paths 140 and 142, the subtone-added digital audio data may be delayed by the phase adjustment sections 154a and 154b to absorb a phase difference between the modulating signal for the VCO 124 and that for the PLL circuit 128 and thereby reduce a time-direction distortion of modulating components of the modulation-resultant signal. Thereby, it is possible to implement stable and accurate modulation which enables a receiver side or a demodulation side to correctly recover transmitted information.

As previously mentioned, one of the phase adjustment sections 154a and 154b may be omitted. For enhancing flexibility, it is preferable to provide both the phase adjustment sections 154a and 154b. The presence of the phase adjustment sections 154a and 154b can easily make compensation for each of various changes in the signal-delay relation between the two modulation paths 140 and 142 which are caused by circuit modifications and parts changes.

The frequency-response adjustment section 156 receives the adjusted digital audio data from the phase adjustment section 154a. In the absence of the phase adjustment section 154a, the frequency-response adjustment section 156 receives the subtone-added digital audio data directly from the signal processing control section 150. The frequency-response adjustment section 156 adjusts the frequency profile of the received audio data so as to enable the modulation index concerning the modulation-resultant signal outputted from the VCO 124 to be flat in the frequency domain.

Figure 6A:
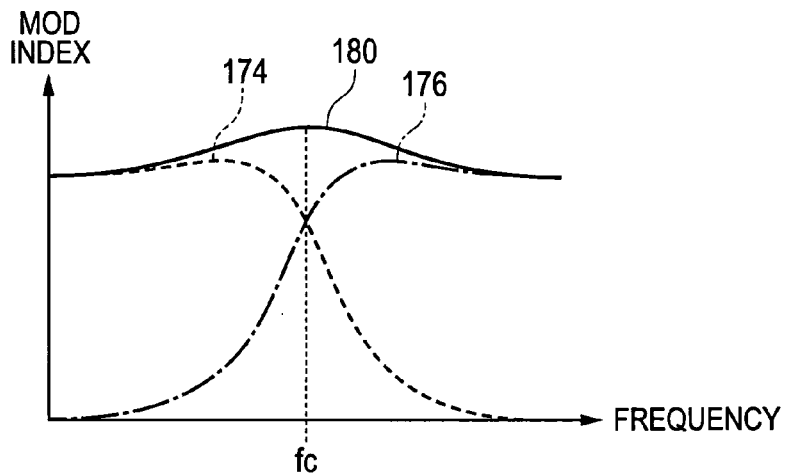
FIG. 6(*a*) is a diagram of the frequency responses of the VCO-based modulation path, the PLL-based modulation path, and the composite modulation circuit in FIG. 1.
Figure 6B:
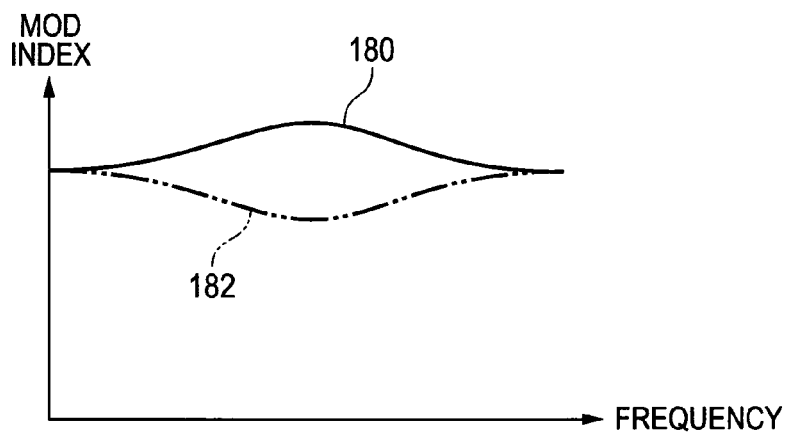
Figure 6C:
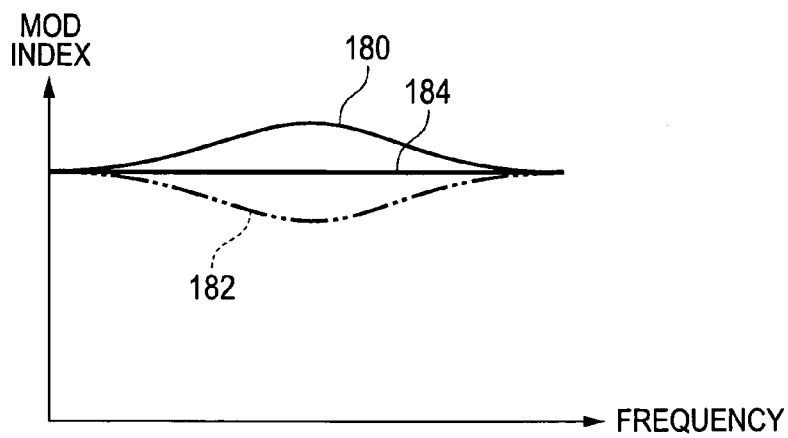

With reference to FIG. 6(a), the frequency response 176 of the VCO-based modulation path 140 and the frequency response 174 of the PLL-based modulation path 142 are added or combined into a composite frequency response (resultant frequency response) 180. The composite frequency response 180 tends to be slightly non-flat in the frequency domain. As shown in FIG. 6(b), there is a frequency response 182 of a filter which is inverted with respect to the composite frequency response 180. The frequency-response adjustment section 156 is designed to serve as the filter having the inverted frequency response 182. Consequently, as shown in FIG. 6(c), the non-flat composite frequency response 180 is corrected into a flat composite frequency response 184 without a peak or peaks in response to the inverted frequency response 182.

A frequency-response adjustment section similar to the frequency-response adjustment section 156 may be provided in the PLL-based modulation path 142 also. In this case, finer waveform shaping can be implemented in a wider frequency range so that the resultant frequency response can be closer to exactly flat one.

Preferably, the frequency-response adjustment section 156 is formed by a known digital filter such as an FIR (finite impulse response) filter or an IIR (infinite impulse response) filter. The digital filter is advantageous over an analog filter in easy designing of a frequency response and independence of an ambient-temperature change.

As mentioned above, the inverted frequency response 182 of the filter formed by the frequency-response adjustment section 156 causes the flat composite frequency response 184 without a peak or peaks.

In the prior-art radio transmitter 10 of FIG. 2, a composite frequency response is adjusted through the use of an electronic volume 14. The electronic volume 14 is expensive. Control of the electronic volume 14 is complicated.

The radio transmitter 100 of FIG. 1 dispenses with the electronic volume 14. Accordingly, the radio transmitter 100 of FIG. 1 is advantageous in cost and compactness over the radio transmitter 10 of FIG. 2.

In the radio transmitter 100 of FIG. 1, the transmission circuit 134 amplifies the modulation-resultant signal outputted from the VCO 124 to generate an amplified modulation-resultant signal. The amplified modulation-resultant signal is fed from the transmission circuit 134 to the antenna 136. The amplified modulation-resultant signal is radiated from the antenna 136 as a radio wave, and is transmitted to the radio receiver 102.

When the radio transmitter 100 implements modulation in a wide frequency range from the direct current to several kHz, at least one of the phase adjustment sections 154a and 154b absorbs a phase difference between the modulating signals in the two modulation paths 140 and 142 to reduce time-domain signal distortion (the loss of a balance) and meet requirements for smaller frequency variation. At the same time, the frequency-response adjustment section 156 causes the flat composite frequency response and thereby provides stable modulation performance. Thus, voices inputted to the radio transmitter 100 can be correctly transmitted to the radio receiver 102.

Figure 7:
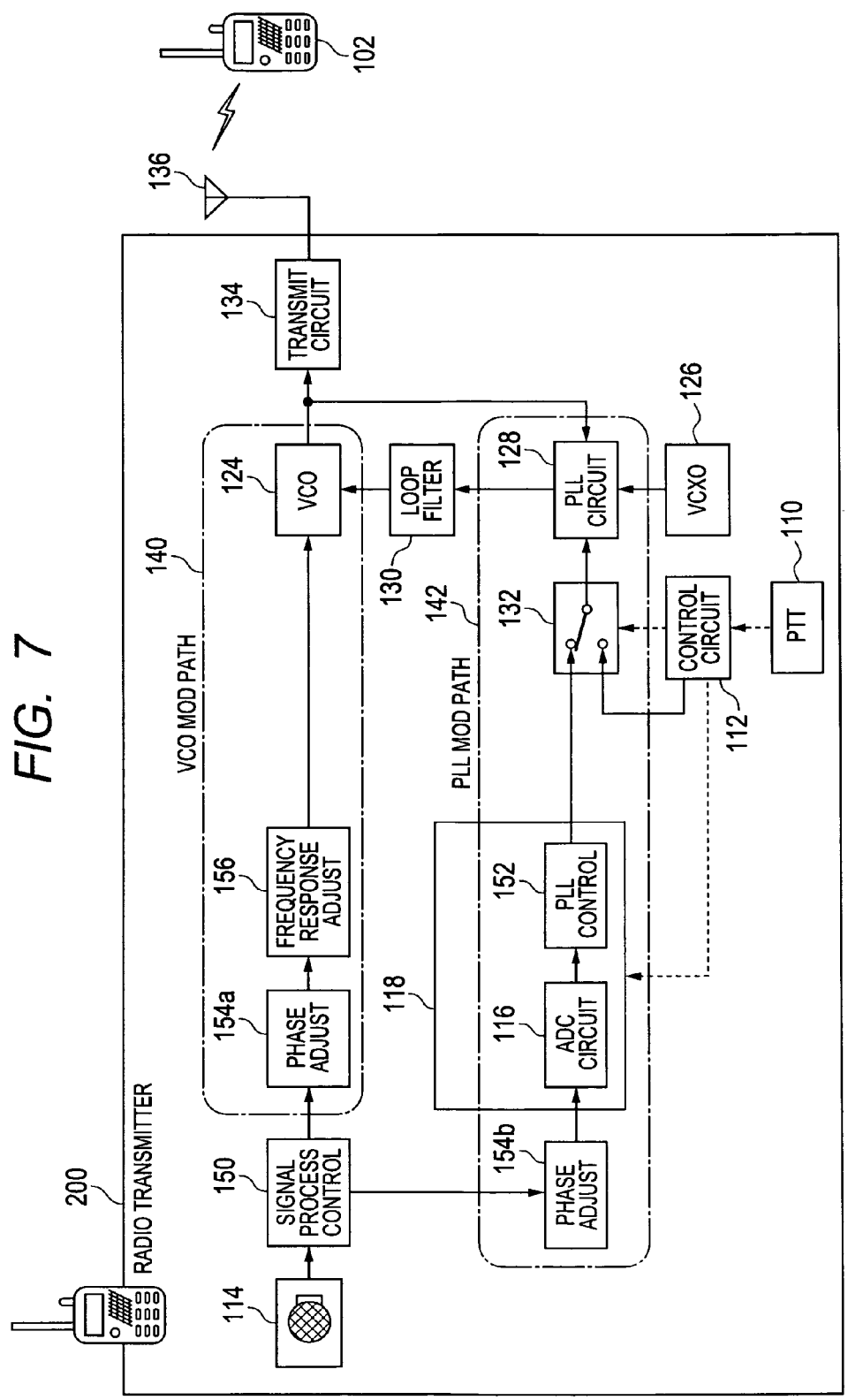
FIG. 7 is a block diagram of a radio transmitter according to a second embodiment of this invention.

FIG. 7 shows a radio transmitter 200 according to a second embodiment of this invention. The radio transmitter 200 is similar to the radio transmitter 100 (see FIG. 1) except for design changes mentioned below.

In the radio transmitter 200, an ADC circuit 116 is located at a stage immediately preceding a PLL control section 152. In the radio transmitter 200, a signal processing control section 150, phase adjustment sections 154a and 154b, and a frequency-response adjustment section 156 are formed by analog circuits rather than digital circuits. Furthermore, in the radio transmitter 200, a DAC circuit 120 and an SMF 122 (see FIG. 1) are omitted, and the frequency-response adjustment section 156 is coupled directly with a VCO 124. The radio transmitter 200 can reduce time-direction signal distortion and provide a flat frequency response concerning modulation.

The preferred embodiments of this invention have been described above with reference to the accompanying drawings. This invention should not be limited by the described preferred embodiments. Various modifications and changes may be made in this invention within the sprit and scope of the appended claims. These modifications and changes should be construed as being embraced in this invention. For example, in the radio transmitter 100 (see FIG. 1), at least one of the signal processing control section 150, the PLL control section 152, the phase adjustment sections 154a and 154b, and the frequency-response adjustment section 156 may be formed by an analog circuit rather than the digital circuit provided that the ADC circuit 116 is moved to a proper place.

What is claimed is:

1. A radio transmitter comprising:
  a signal processing circuit splitting a basic modulating signal into first and second modulating signals and outputting the first and second modulating signals;
  a PLL deciding a fundamental wave;
  a VCO forming a portion of the PLL and modulating the fundamental wave decided by the PLL in accordance with a voltage of the first modulating signal outputted from the signal processing circuit;
  a PLL circuit forming a portion of the PLL and varying a frequency division ratio to modulate the fundamental wave decided by the PLL in accordance with the second modulating signal outputted from the signal processing circuit; and
  a phase adjustment section adjusting at least one of phases of the first and second modulating signals and thereby equalizing the phases of the first and second modulating signals.

2. A radio transmitter as recited in claim 1, further comprising a frequency-response adjustment section adjusting at least one of frequency profiles of the first and second modulating signals.

3. A radio transmitter comprising:
  a PLL providing a carrier;
  a VCO in the PLL;
  a frequency divider in the PLL and having a variable frequency division ratio;
  a first path transferring a modulating signal and applying the transferred modulating signal to the VCO as a control voltage for the VCO to modulate the carrier in accordance with the modulating signal applied to the VCO;
  a second path transferring the modulating signal and applying the transferred modulating signal to the frequency divider to vary the frequency division ratio of the frequency divider and thereby modulate the carrier in accordance with the modulating signal applied to the frequency divider; and
  a phase adjuster adjusting at least one of phases of the modulating signal applied to the VCO and the modulating signal applied to the frequency divider and thereby equalizing the phases of the modulating signal applied to the VCO and the modulating signal applied to the frequency divider;
  wherein the modulation of the carrier in accordance with the modulating signal applied to the VCO and the modulation of the carrier in accordance with the modulating signal applied to the frequency divider are simultaneously active.

4. A radio transmitter as recited in claim 3, further comprising a frequency-response adjuster adjusting at least one of frequency profiles of the modulating signal applied to the VCO and the modulating signal applied to the frequency divider.

* * * * *